(12) United States Patent
Arai et al.

(10) Patent No.: US 6,838,833 B2
(45) Date of Patent: *Jan. 4, 2005

(54) PLASMA PROCESSING APPARATUS

(75) Inventors: Masatsugu Arai, Chiyoda (JP); Ryujiro Udo, Ushiku (JP); Naoyuki Tamura, Kudamatsu (JP); Masanori Kadotani, Kudamatsu (JP); Motohiko Yoshigai, Hikari (JP)

(73) Assignees: Hitachi, Ltd., Tokyo (JP); Hitachi High-Technologies Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/670,288

(22) Filed: Sep. 26, 2003

(65) Prior Publication Data

US 2004/0061449 A1 Apr. 1, 2004

Related U.S. Application Data

(63) Continuation of application No. 10/083,381, filed on Feb. 27, 2002, now Pat. No. 6,664,738.

(51) Int. Cl.⁷ .................................................. H01J 7/24
(52) U.S. Cl. .............................. 315/111.21; 313/231.31; 118/723 R
(58) Field of Search ....................... 315/111.21, 111.31, 315/111.41, 111.71, 111.81, 111.91; 118/723, 723 R, 723 VE, 723 MW, 723 ER, 723 IR; 313/231.31; 204/298.07, 298.09, 192.12; H01J 7/24

(56) References Cited

U.S. PATENT DOCUMENTS

| 5,173,641 | A | 12/1992 | Imahashi et al. ....... 315/111.41 |
| 5,781,400 | A | 7/1998 | Takahashi et al. .......... 361/237 |
| 5,910,221 | A | 6/1999 | Wu ........................ 118/723 R |
| 5,914,568 | A | 6/1999 | Nonaka .................. 315/111.21 |
| 6,391,147 | B2 | 5/2002 | Imafuku et al. ........ 156/345.47 |
| 6,447,636 | B1 | 9/2002 | Qian et al. .............. 156/345.48 |
| 6,494,998 | B1 | 12/2002 | Brcka ..................... 204/192.12 |
| 6,664,738 | B2 * | 12/2003 | Arai et al. ............... 315/111.21 |

FOREIGN PATENT DOCUMENTS

| JP | 8-045909 | 2/1996 | ......... H01L/21/205 |
| JP | 9-017770 | 1/1997 | ........... H01L/21/68 |
| JP | 2000-216140 | 8/2000 | ........... H01L/21/68 |

* cited by examiner

Primary Examiner—Don Wong
Assistant Examiner—Trinh Vo Dinh
(74) Attorney, Agent, or Firm—Antonelli, Terry, Stout & Kraus, LLP

(57) ABSTRACT

A plasma processing apparatus provided with a holding stage of a system in which a temperature of an electrode block is controlled so as to control the temperature of a semiconductor wafer. The electrode block is provided with at least first and second independent temperature controllers on inner and outer sides thereof, and a slit for suppressing heat transfer is provided in the electrode block between the first and second temperature controllers.

6 Claims, 7 Drawing Sheets

PLASMA PROCESSING APPARATUS

CROSS REFERENCE TO RELATED APPLICATION

This is a continuation of U.S. application Ser. No. 10/083,381, filed Feb. 27, 2002, now U.S. Pat. No. 6.664.738, the subject matter of which is incorporated by reference herein.

BACKGROUND OF THE INVENTION

The present invention relates to a plasma processing apparatus applied to microfabrication in semiconductor fabricating processes or the like and, more particularly, to a plasma processing apparatus provided with a holding stage on which a semiconductor wafer is to be placed.

With the trend toward high integration design of semiconductor devices becoming remarkable in recent years, ever-increasing miniaturization of circuit patterns has been demanded and dimensional fabrication accuracy required has been increasingly severe. Moreover, at the same time, it has become necessary to meet requirements for improved throughput and larger areas of workpieces to be treated and the temperature controllability of semiconductor wafers during processing has become very important.

For example, in an etching process that requires a high aspect ratio (fine and deep trenches), anisotropic etching is required and in order to realize this, a process in which etching is performed while protecting side walls with an organic polymer is adopted and, in this case, the generation of an organic polymer that provides protective films varies depending on temperature. If the temperature within a semiconductor wafer during etching processing is nonuniformly distributed, the degree of formation of side wall protecting films varies in the wafer plane, with the result that etching shape also may sometimes become nonuniform, thus posing a problem.

Also, there is a case where reaction products adhere to etched surfaces again, thereby lowering etching rates. The reaction products are apt to be distributed more at the center of a semiconductor wafer than near the outer periphery of the semiconductor wafer, with the result that the etching rate is lower at the center of the semiconductor wafer than near the outer periphery and, therefore, the etching shape within the semiconductor wafer plane deviates.

In order to improve this, it is effective to adopt a method by which the re-adhering of reaction products is suppressed by raising the temperature near the center of a wafer in comparison with the temperature near the outer periphery. Therefore, as described above, it is necessary to control the semiconductor wafer temperature during plasma etching so that it is uniform in the wafer plane or to cancel out the distribution of reaction products by intentionally raising the temperature in the plane of a semiconductor wafer at the center or near the outer periphery.

Incidentally, it is a general practice to realize the semiconductor wafer temperature control during processing by controlling the surface of an electrostatic chuck (a holding stage) on which the wafer to be treated is placed, and as a method of temperature control for such a semiconductor wafer during processing, a technique disclosed in JP-A-2000-216140 (prior art 1), for example, can be mentioned.

In this prior art 1, there is disclosed a structure such that a plurality of independent coolant flow paths capable of controlling the flow rate of coolant are provided within an electrostatic electrode block that constitutes a holding stage and the electrode block surface is coated with a dielectric film.

Furthermore, in JP-A-9-17770 (prior art 2) is disclosed a structure such that in order to control the in-plane temperature distribution of a semiconductor wafer, two systems of coolant flow path are provided on concentric circles in the interior of an electrostatic chuck, whereby a relatively low-temperature coolant is caused to circulate in an outer coolant flow path and a relatively high-temperature coolant is caused to circulate in an inner coolant flow path. In JP-A-845909 (prior art 3) is disclosed a sample bed (a holding stage) of such a structure that a metal electrode block is divided into portions, in each of which a coolant flow path or a heater is provided to perform temperature control.

In the above prior arts, consideration is not given to the flow of heat in an electrostatic chuck and there was a problem in positively realizing a clear temperature distribution.

For examples, in the prior arts 1 and 2, in order to realize a temperature distribution in which the temperature near the center of a semiconductor wafer during processing is set higher than the temperature near the outer periphery of the wafer, the temperature or flow rate of a coolant is controlled. However, a clear in-plane temperature distribution cannot be obtained because of the thermal conductivity of the electrode block and, at the same time, because coolant flow paths are adjacent to each other, the temperature is made uniform within the electrode block, making it further impossible to obtain a clear temperature distribution.

On the other hand, in the electrostatic chuck disclosed as the prior art 3, independent temperature control is possible within divided electrode blocks and in-plane temperature distribution control is accomplished. However, because there is a gap between the blocks, it is difficult to form dielectric films of thin film thickness with good reliability.

Also, in the prior art 1, the electrode is fixed by means of screws only in the circumferential part and, therefore, the electrode block is deformed in convex shape by the pressure of the coolant, with the result that in some cases it is impossible to uniformly adsorb the semiconductor wafer and an undesired temperature distribution is generated in the plane of the semiconductor wafer.

SUMMARY OF THE INVENTION

The object of the invention is to provide a plasma processing apparatus capable of positively controlling the temperature distribution of a semiconductor wafer during etching processing in a clear state.

The above-described object can be achieved by using a plasma processing apparatus provided with a holding stage of a method by which the temperature of an electrode block is controlled thereby to control the temperature of a semiconductor wafer. In this holding stage, the electrode block is provided with independent temperature control means on the inner and outer sides and, at the same time, a slit for suppressing heat transfer is provided between these temperature control means.

In this plasma processing apparatus, the above-described slit for suppressing heat transfer may be formed almost concentrically.

Also, the above-described object can be achieved by using a plasma processing apparatus, in which the above-described independent temperature control means on the inner and outer sides may comprise: a first flow path and a second flow path, which are provided in the electrode block independently on the inner and outer sides of the electrode block; and first heat-medium supply means and second heat-medium supply means, which independently supply to these first and second flow paths a heat medium, for which at least either of temperature and flow rate is controlled. Similarly, the above-described object can be achieved by using a plasma processing apparatus, in which above-described independent temperature control means on the inner and outer sides may comprise: a first flow path and a second flow path, which are provided in the above-described electrode block independently on the inner and outer sides of the electrode block; first heat-medium supply means and second heat-medium supply means, which commonly supply to these first and second flow paths a heat medium, for which at least either of temperature and flow rate is controlled; and temperature adjustment means provided in a conduit that connects the above-described first and second flow paths together.

Furthermore, the above-described temperature adjustment means may be constituted by a heater, and this heater may be provided on the backside of the above-described electrode block or may be built in the above-described electrode block.

Next, the above-described electrode block may be provided, on its surface, with a dielectric film, and a heater may be built within the dielectric film. The above-described heater may serve also as an electrostatic chuck.

Also, the above-described electrode block may comprise one member in which the above-described heat-medium flow paths are formed and the other member for ensuring the rigidity of the above-described electrode block, and these members may be fastened in one piece. Means for fastening the above-described two members may be any of screwing, brazing, diffusion bonding and electron beam welding. Moreover, the member for ensuring rigidity may be made of a material with a lower thermal conductivity than the above-described electrode block.

Or the above-described first and second flow paths may be each formed from a pipe with a circular section or a polygonal shape attached to the above-described electrode block. Moreover, the above-described pipe may be built in the above-described electrode block.

Also, the above-described electrode block may be provided with at least three temperature sensors and temperature control may be performed on the basis of information from these temperature sensors. The above-described electrode block may be provided, on its surface, with a dielectric film and may be constructed as an electrostatic chuck in which a gas for heat transfer is introduced to between the above-described dielectric film and the above-described semiconductor wafer.

Other objects, features and advantages of the invention will become apparent from the following description of the embodiments of the invention taken in conjunction with the accompanying drawings.

DESCRIPTION OF THE PREFERRED EMBODIMENTS

A plasma processing apparatus according to the invention will be described below in detail with the aid of the illustrated embodiments.

Figure 1:
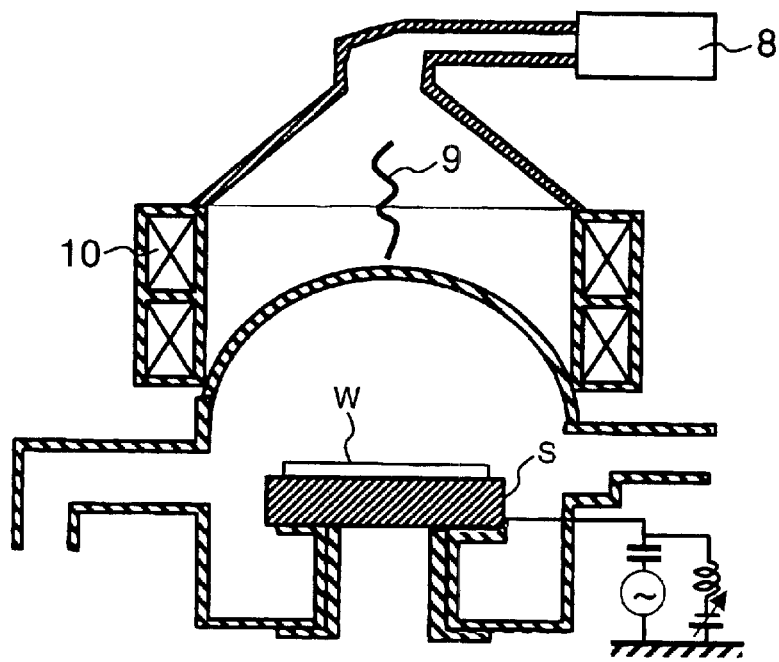
FIG. 1 is an explanatory drawing of an embodiment of a plasma processing apparatus according to the invention.
Figure 2:
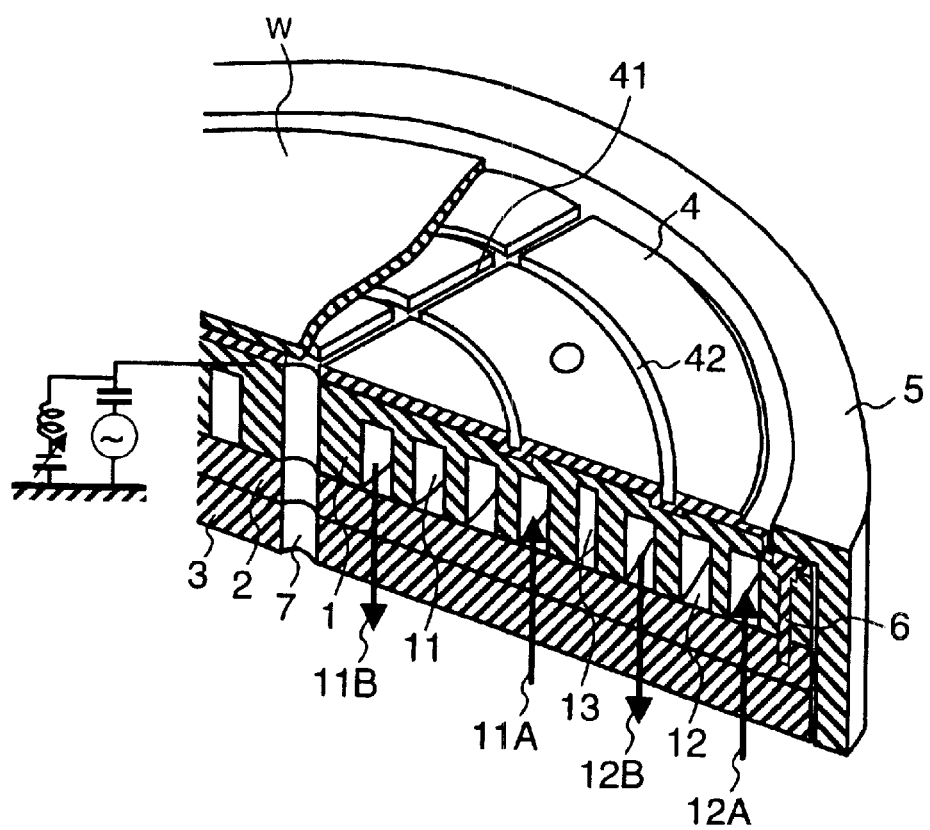
FIG. 2 is a perspective view of an embodiment of an electrostatic chuck in a plasma processing apparatus according to the invention.

FIG. 1 shows an embodiment of a plasma processing apparatus P according to the invention, and FIG. 2 is a perspective view, partially in section, of an electrostatic chuck S, which is used in this plasma processing device as a holding stage S for a semiconductor wafer W. Incidentally, this holding stage is generally called an electrostatic chuck and hence is hereinafter referred to as an electrostatic chuck S.

And in the case of the electrostatic chuck S related to this embodiment, as will be described later with the aid of FIGS. 3 and 4, flow paths for a fluid (a heat medium) that works as a coolant or heat medium and, as shown in FIG. 1, this electrostatic chuck S is installed and used in a plasma processing device related to an embodiment of the invention.

As shown in FIG. 2, this electrostatic chuck S is constituted by an electrode block 1 made of aluminum having a thickness of 25 mm, a guide member 2 made of a stainless steel having a thickness of 10 mm, a base member 3 having a thickness of 10 mm, a dielectric film 4, and an electrode cover 5 made of ceramics, and is fabricated to have a diameter of 320 mm and a total thickness of 45 mm when it is intended for use in a semiconductor wafer of 12 inches (300 mm) in diameter, for example.

Figure 3:
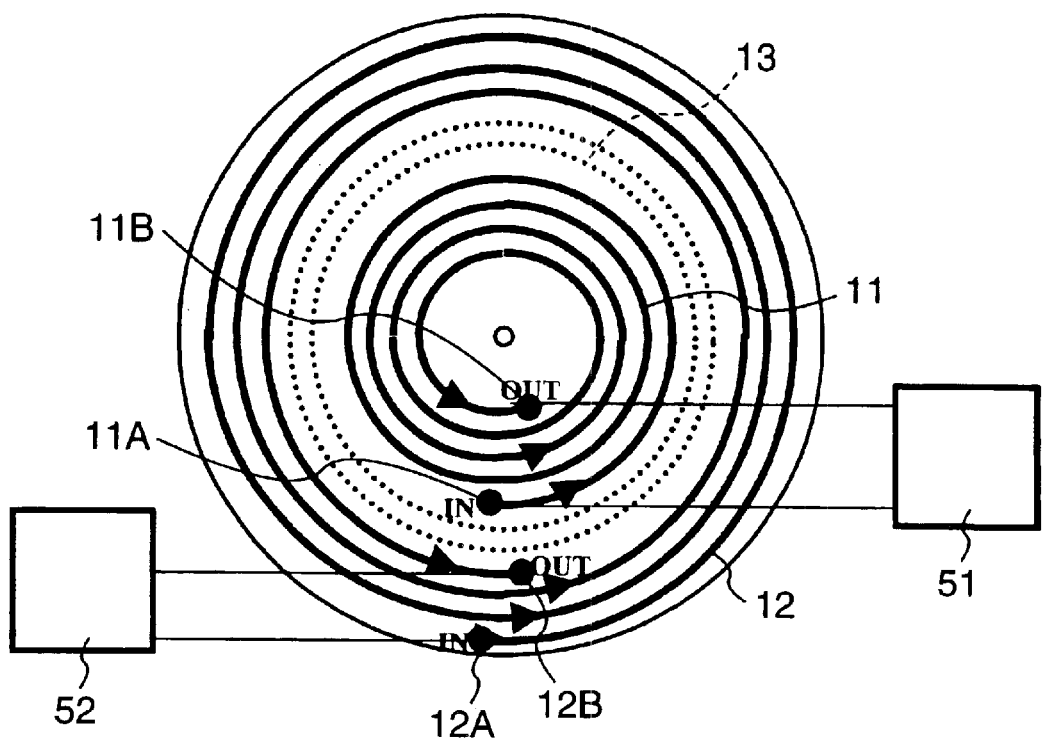
FIG. 3 is an explanatory drawing of the slit arrangement state in another embodiment of an electrostatic chuck according to the invention.
Figure 4:
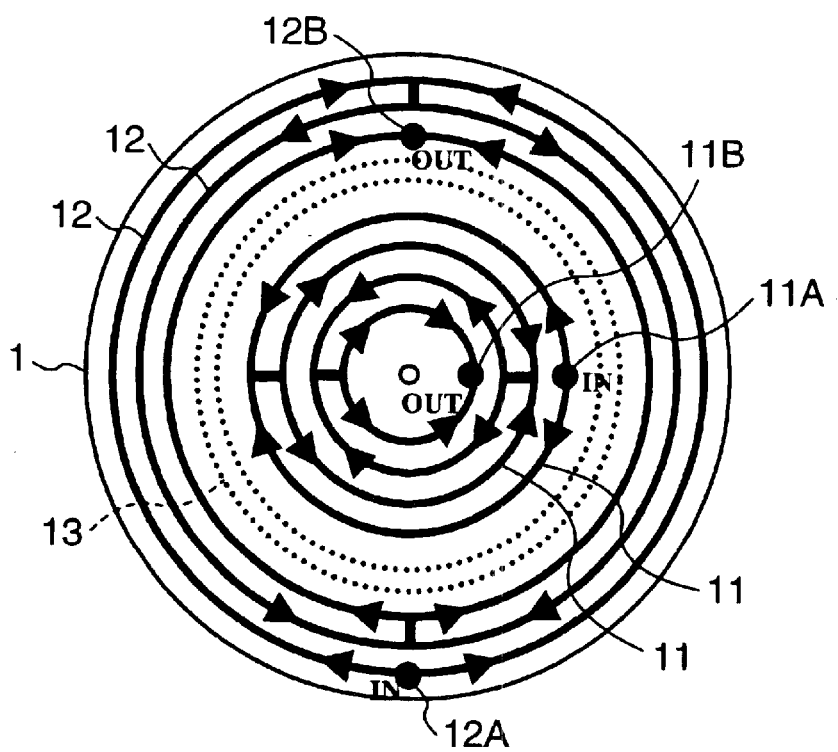
FIG. 4 is explanatory drawing of the alit arrangement state in a further embodiment of an electrostatic chuck according to the invention.

First, as shown in FIG. 3, on the undersurface of the electrode block 1 are formed flow-path slits 11, 12 that are disposed in spiral form in such a manner that the two constitute, respectively, a slit on the inside diameter side and a slit on the outside diameter side, and between the two slits 11, 12 is formed an almost concentric slit for suppressing heat transfer 13 (radius=90 mm, width=5 mm, height (depth)=18 mm).

And upon the undersurface of this electrode block 1 is superposed the guide member 2, and the open portions of each slit 11, 12, 13 are blocked by fixing the guide member 2 with bolts 6. A gas introduction hole 7 is provided in such a manner that the gas introduction hole 7 passes through the electrode block 1 and guide member 2 including the base member 3.

Next, the dielectric film 4 is formed, for example, from high-purity alumina ceramics and its thickness is 0.1 mm. However, the material and thickness of this dielectric film 4 are not limited to this example and in the case of synthetic resins, for example, a thickness from 0.1 mm to a few millimeters can be selected according to the dielectric constant of the material.

And as shown in FIG. 2, this dielectric film 4 is provided with a linear slit 41, which extends radially while communicating with the gas introduction hole 7, and a plurality of concentric slits 42 that communicate with this linear slit 41, whereby it is ensured that when the semiconductor wafer W is placed on the electrostatic chuck S, helium gas is introduced from the gas introduction hole 7 into a gap between the dielectric film 4 and the semiconductor wafer W.

Each of the flow-path slits 11, 12 of the electrode block 1 is provided with introduction portions 11A, 12A and discharge portions 11B, 12B for a coolant (or a heat medium), whereby each of the flow-path slits 11, 12 can work as mutually independent heat-medium flow paths for the passage of a coolant for temperature control. And the introduction portions 11A, 12A and discharge portions 11B, 12B of each of the flow-path slits 11, 12 are connected to coolant supply units 51, 52, which are respectively independent, so that at least either of the flow rate and temperature of the coolant to be circulated to each of the flow-path slits 11, 12 can be individually adjusted.

The arrangement of the flow-path slits 11, 12 is not limited to the spiral shape shown here. For example, FIG. 4 shows a case where the flow-path slits 11, 12 are each arranged in a plurality of concentric circles, and in this case a coolant flows in semicircular directions that are mutually counter directions.

Next, the operation of a plasma processing apparatus according to this embodiment will be described. First, the electrostatic chuck S is installed within the processing chamber shown in FIG. 1, the semiconductor wafer W is placed on the electrostatic chuck S, a chlorine-based or fluorine-based gas is introduced, the atmosphere in the processing chamber is irradiated with a microwave 9 generated by a magnetron 8 thereby to excite a plasma, and the distribution and density of the plasma are controlled by a magnetic field generated by solenoid coils 10.

And at the same time, etching is performed by applying a DC current and a high frequency to the electrode block 1 of electrostatic chuck S (FIG. 2) while controlling the temperature of the semiconductor wafer W.

Incidentally, the embodiment of the plasma processing apparatus according to the invention is not limited to the method based on the use of a magnetron described here, and a plasma processing device of other methods may be used.

Next, for the operation of the electrostatic chuck in this embodiment, the principle of temperature control will be first described below.

First, this electrostatic chuck S adsorbs the semiconductor wafer W by a Coulomb force or a Johnsen-Rahbeck force that is generated by the application of a high voltage to the dielectric film 4. There are two types of methods of application of a high voltage, i.e., the unipolar type and bipolar type. In the unipolar type, a uniform voltage is applied across the semiconductor wafer and the dielectric film, whereas in the bipolar type, two or more kinds of electric potentials are applied across the semiconductor wafer and the dielectric film. In this embodiment, either of the two types may be used.

After adsorption, as described above, helium gas for heat transfer (usually, 1000 Pa or so) is introduced from the gas introduction hole 7 into a gap between the semiconductor wafer W and the dielectric film 4. The temperature of the semiconductor wafer W is governed by the heat input from the plasma, the overall heat transfer coefficient of the gap filled with He gas, the thermal resistance of the electrode block 1, and the overall heat transfer coefficient between the coolant that is caused to circulate into the electrode block 1 and the electrode block 1.

Therefore, the control of the temperature of the semiconductor wafer W can be performed either by installing a mechanism for changing the pressure of helium gas on the electrostatic chuck S, the temperature of the coolant, the flow rate of the coolant (a change in the overall heat transfer coefficient between the coolant and the electrode block) or by installing a second temperature adjustment mechanism such as a heater.

For example, in a case where the size of the flow-path slits 11, 12 is 5 mm width×16 mm height, it has been ascertained that if the flow rate of a coolant at 20° C. is doubled from 2 l/min to 4 l/min, then the overall heat transfer coefficient between the coolant and the electrode block 1 increases from about 200 W/m2K to about 400 W/m2K. Therefore, because the overall heat transfer coefficient can be increased by increasing the flow rate of the coolant, a temperature rise of the electrode block 1 can be held to a low level even if the heat input from the plasma increases.

Incidentally, in a general electrostatic chuck, for reasons of its structure a temperature distribution occurs in the plane of a semiconductor wafer as described below in spite of uniform heat input from a plasma. Because the pressure of helium gas introduced into a gap between the semiconductor wafer and a dielectric film is higher than the pressure in the chamber (processing chamber) during the generation of a plasma, the gas leaks from the outermost peripheral part of the semiconductor wafer W. The measured volume of leaking gas is 2 to 5 ml/min.

Figure 5:
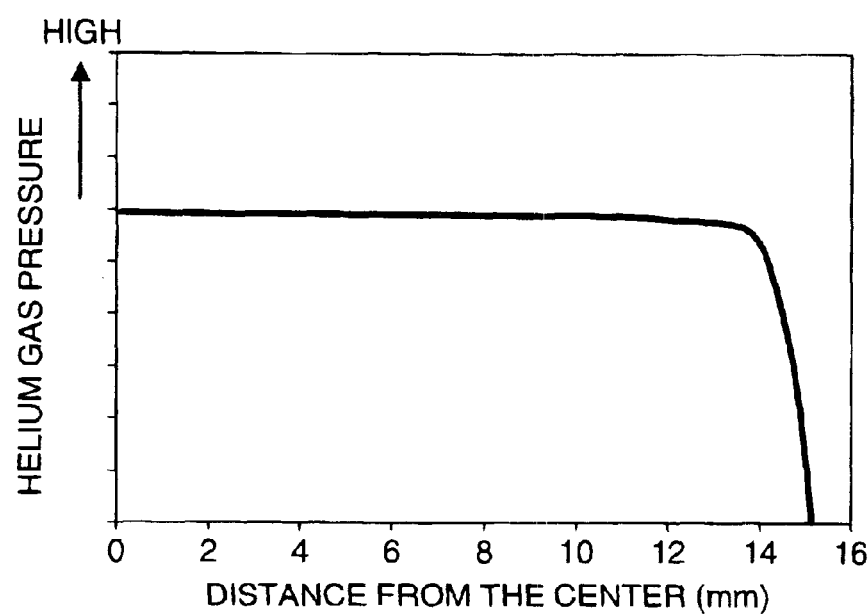
FIG. 5 is a characteristic diagram of an example of pressure distribution of helium gas between an electrostatic chuck and a semiconductor wafer.

FIG. 5 shows an example of calculation result of helium gas pressure. In this graph are shown calculated values of pressure distribution on the backside of a semiconductor wafer found from the leak rate of helium gas. As shown in this figure, because the helium gas pressure at the outermost periphery of the semiconductor wafer is higher than the chamber pressure during the generation of a plasma, the helium gas pressure drops abruptly at the outer periphery of the semiconductor wafer.

Figure 6:
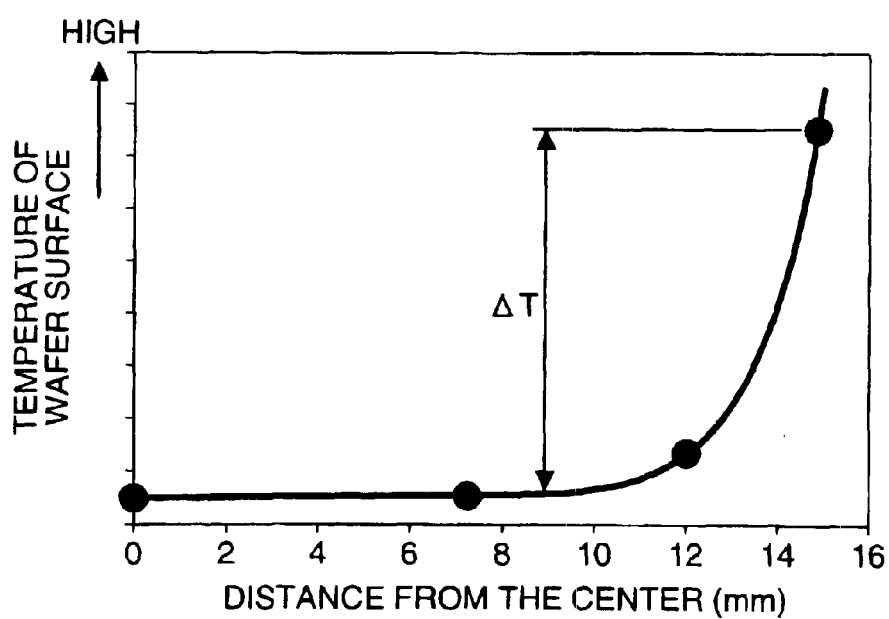
FIG. 6 is a characteristic diagram of an example of the surface temperature of a semiconductor wafer by an electrostatic chuck.

Next, FIG. 6 shows the surface temperature of the semiconductor wafer W in a case where heat input is uniform in the plane of the semiconductor wafer. In FIG. 1 are shown results obtained in a case where a plasma is generated in an atmosphere into which a fluorine-based gas (pressure 1 Pa) is introduced by use of the plasma processing apparatus shown in FIG. 1 and where the flow rate of the coolant is set at 5 l/min and the temperature of the coolant is set at 35° C.

The abscissa indicates the distance from the center of the semiconductor wafer and the ordinate indicates the temperature of the semiconductor wafer surface. The mark • denotes measured values and the solid line represents calculated values.

Therefore, from FIGS. 5 and 6, it is apparent that the surface temperature of the semiconductor is higher at the outermost periphery than at the center.

Next, the temperature difference in the plane of the semiconductor wafer, which is denoted by ΔT, depends mainly on high-frequency electric power applied to the electrostatic chuck, and reached about 10° C. when power of 1300 W, for example, was applied.

Therefore, in order to give a gentle temperature distribution (for example, the temperature at the center or at the periphery is high) on the plane of the semiconductor wafer by means of the electrostatic chuck, it is necessary to control the temperature distribution in consideration of the pressure distribution of helium gas.

Incidentally, the foregoing applies to general electrostatic chucks including prior art. Next, an explanation will be given to the electrostatic chuck S related to the embodiment of the invention shown in FIG. 1. In this embodiment, the electrode block 1 that constitutes this electrostatic chuck S is provided with the slit for suppressing heat transfer 13 in such a manner that the slit 13 defines a boundary between the inner and outer peripheral parts of the electrode block 1.

Furthermore, in this electrostatic chuck S, the electrode block 1 is provided with the independent flow-path slit 11 and flow-path slit 12 in such a manner that the flow-path slits 11 and 12 sandwich the slit for suppressing heat transfer 13 on the inner and outer peripheral sides, and at least either of the flow rate and temperature of the coolant can be individually adjusted.

The slit for suppressing heat transfer 13 is kept blocked by the guide member 2 as described above and, therefore, the interior of the slit for suppressing heat transfer 13 is filled with an atmosphere at a pressure almost equal to the pressure in the processing chamber or is kept in a vacuum. For this reason, the slit for suppressing heat transfer 13 suppresses heat transfer between the inner and outer peripheral sides of the electrode block 1, thus allowing a large temperature difference between the two sides to occur.

Figure 7:
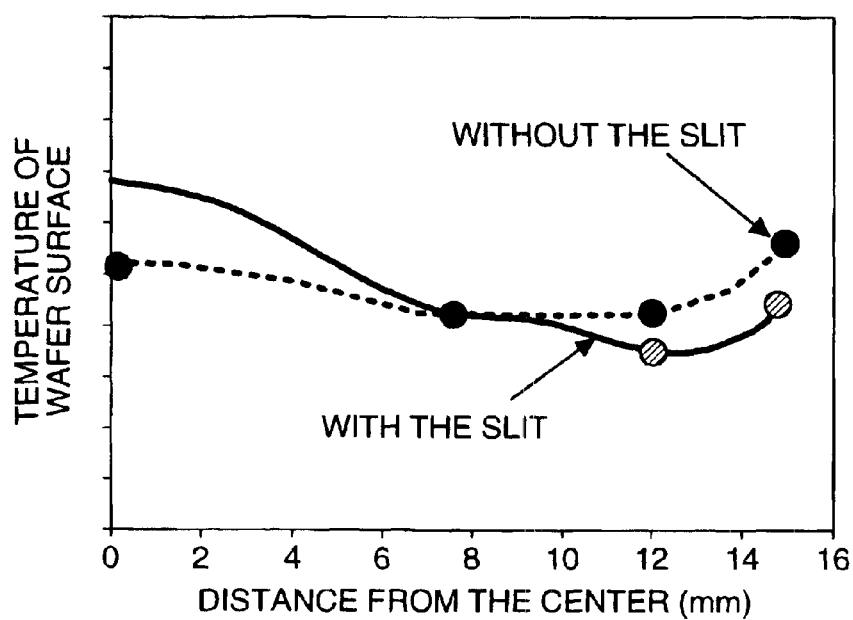
FIG. 7 is a characteristic diagram of an example of the surface temperature of a semiconductor wafer in an embodiment of an electrostatic chuck according to the invention as compared with prior art.

FIG. 7 shows an example of measurement of the surface temperature distribution of a semiconductor wafer W obtained under the same conditions as in FIG. 6 by use of an electrostatic chuck S that is provided, in the electrode block 1, with the slit for suppressing heat transfer 13. In this example, a case where the temperature in the center part is set relatively higher than the temperature in the outer peripheral part is supposed. In this example, the high-frequency electric power applied to the electrostatic chuck is 100 to 1300 W, the coolant flow rate in the slit 11 is 1 to 4 l/min, and the coolant flow rate in the slit 12 is 4 to 8 l/min.

As shown in FIG. 7, it is apparent that in the electrostatic chuck S that is provided with the slit for suppressing heat transfer 13 as one embodiment of the invention, the temperature in the center part can be raised sufficiently high while holding the temperature of the outermost peripheral part of the surface of the semiconductor wafer W to a low level.

Figure 8:
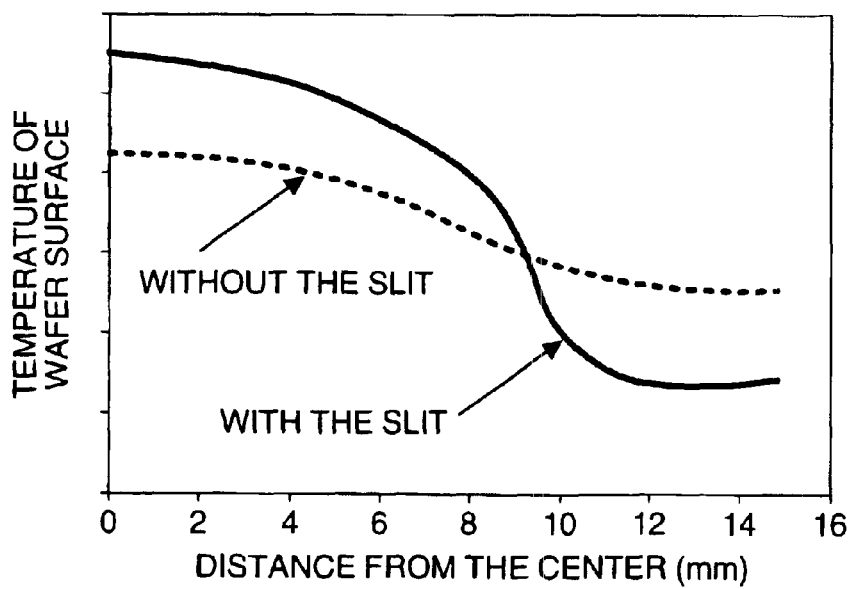
FIG. 8 is a characteristic diagram of an example of the surface temperature of a dielectric film in an embodiment of an electrostatic chuck according to the invention as compared with prior art.

Next, FIG. 8 shows the result of an analysis of the surface temperature of the dielectric film 4. As shown in the figure, the slit for suppressing heat transfer 13 is provided also in this case and, therefore, the temperature distribution of the surface of dielectric film 4 is remarkable. Therefore, it is apparent that a very distinct temperature distribution was obtained. It is also apparent that the temperature distribution changes greatly on both sides of the slit for suppressing heat transfer 13.

In this type of electrostatic chuck, as described above, it is a general phenomenon that the helium gas pressure is low in the outermost peripheral part of the semiconductor wafer and that the temperature is high in the outermost peripheral part of the semiconductor wafer. Therefore, in the case of this embodiment, in order to hold the temperature of the outermost peripheral part of the semiconductor wafer W to a low level and, at the same time, to raise the temperature in the center part, it is necessary to install the slit for suppressing heat transfer 13 in an appropriate position.

In this embodiment, good results were obtained by setting the position of the slit for suppressing heat transfer 13 intended for use, for example, in the above-described semiconductor wafer with a diameter of 300 mm in the range of 80 to 120 mm from the center. In the case of a semiconductor wafer W having a diameter of 200 mm, this range is 60 to 80 mm.

Therefore, as is apparent from these results, in the electrostatic chuck S according to the embodiment of the invention, it is preferred that the slit for suppressing heat transfer 13 be provided in the range of 50 to 80% of the radius of the electrode block 1.

Incidentally, a temperature distribution desired for semiconductor wafers in plasma processing is usually a gentle circumferential distribution in which the temperature in the center part or in the outer peripheral part is high, and for this reason, it is preferred that the slit for suppressing heat transfer 13 of electrostatic chuck S be concentrically formed.

On the other hand, it is preferred that the sectional shape of this slit for suppressing heat transfer 13 be rectangular, trapezoidal, etc. from the standpoint of fabrication. It is the dimension of height of the sectional shape that is important, and the higher the height, that is, the more the height of the slit for suppressing heat transfer 13.

The more the effect of this slit to suppress heat transfer will increase. However, when the height of the slit for suppressing heat transfer 13 increases in this manner, the rigidity of the electrode block 1 decreases. In this case, therefore, a rib may be provided in the slit thereby to prevent a decrease in the rigidity of the electrode block 1.

Therefore, according to this embodiment of the invention, it is possible to clearly control the temperature distribution of the semiconductor wafer W during plasma etching, with the result that through arbitrary temperature control it is possible to ensure a uniform temperature in the plane of the semiconductor wafer or a temperature distribution in a clear state, such as a temperature distribution pattern in which the temperature in the center portion or a temperature distribution pattern in which the temperature in the outer peripheral portion is high. As a result, this embodiment of the invention can be easily applied to plasma processing in which by canceling out the distribution of reaction products the re-adhering of the reaction products to etched surfaces is suppressed, thus contributing greatly to an improvement in the yield of semiconductor wafer processing.

Figure 9:
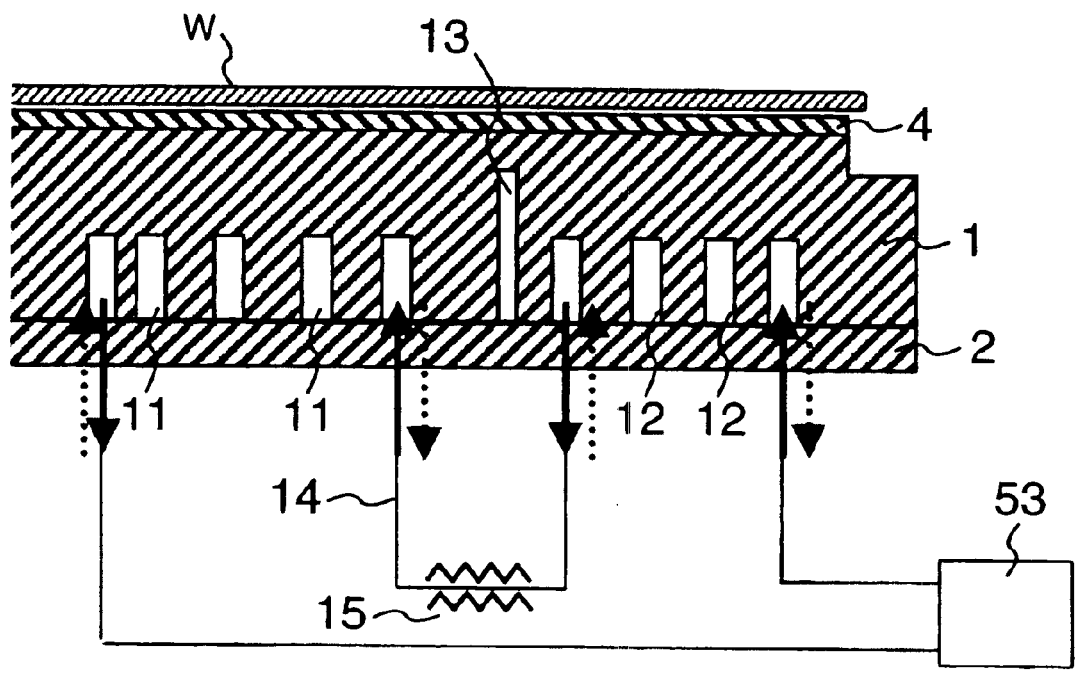
FIG. 9 is a sectional view of the second embodiment of an electrostatic chuck according to the invention.

Next, further embodiments of the invention will be described below. First, FIG. 9 shows an electrostatic chuck in the second embodiment of the invention. In this embodiment, a slit for suppressing heat transfer 13 is provided in an electrode block 1, a slit 11, which provides a coolant flow path on the inner peripheral side, and a slit 12, which provides a coolant flow path on the inner peripheral side, are connected in series by means of a conduit 14, and an electric heater 15 is provided in this conduit 14 to constitute an electrostatic chuck S1.

And in this electrostatic chuck S1, a coolant is supplied from one coolant supply unit 53 commonly to the slit 11 and slit 12, which are the coolant flow paths in the electrode block 1. During coolant supply, the temperature is controlled by a power controller, which is not shown in the figure, and the heater 15 works to heat the coolant flowing through the conduit 14 to a prescribed temperature.

Therefore, according to this electrostatic chuck S1, by adjusting the heating temperature of the coolant by the heater 15, the temperature distribution of the semiconductor wafer W can be easily changed to a temperature distribution pattern in which the temperature in the center part is high or a temperature distribution pattern in which the temperature in the outer peripheral part is high.

That is, when the temperature distribution of the semiconductor wafer W is to be changed to a temperature distribution pattern in which the temperature in the center part is high, it is necessary only that the heating temperature of the coolant by the heater 15 be controlled by causing the coolant to circulate in the direction indicated by solid-line arrows. Conversely, when the temperature distribution of the semiconductor wafer W is to be changed to a temperature distribution pattern in which the temperature in the outer peripheral part is high, it is necessary only that the coolant be caused to circulate in the direction indicated by dotted-line arrows.

Therefore, also through the use of this electrostatic chuck S1 as with the electrostatic chuck S described in FIGS. 1 to 4, it is possible to clearly control the temperature distribution of the semiconductor wafer W during plasma etching, with the result that through arbitrary temperature control it is possible to ensure a uniform temperature in the plane of the semiconductor wafer or a temperature distribution in a clear state, such as a temperature distribution pattern in which the temperature in the center portion or a temperature distribution pattern in which the temperature in the outer peripheral is high. As a result, this embodiment of the invention can be easily applied to plasma processing in which by canceling out the distribution of reaction products the re-adhering of the reaction products to etched surfaces is suppressed, thus contributing greatly to an improvement in the yield of semiconductor wafer processing.

In addition, according to this electrostatic chuck S1, installation of one coolant supply unit 53 is sufficient and, therefore, the composition of the apparatus can be simplified.

Also, in the case of this electrostatic chuck S1, installation of the heater 15 within the conduit 14 enables space to be effectively utilized and this construction is very effective also from the standpoint of thermal efficiency.

Incidentally, in the embodiment shown in FIG. 9, the description was made about a case where the heater 15 is of the electric heating type. However, a Peltier element may be used as the heater 15 and in this case, it is possible not only to heat the coolant in the conduit 14, but also cool to this coolant.

Figure 10:
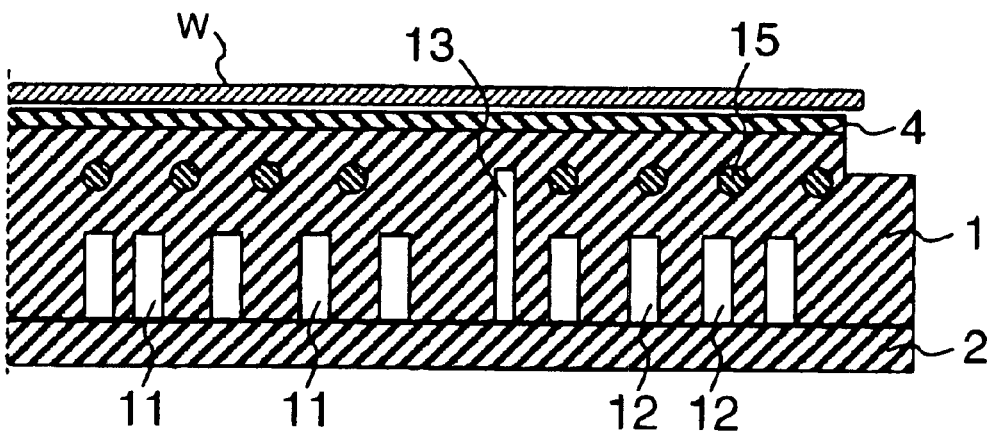
FIG. 10 is a sectional view of the third embodiment of an electrostatic chuck according to the invention.

Next, FIG. 10 shows the third embodiment of the invention. In this embodiment, a heater 15 is built in an electrode block 1 to constitute an electrostatic chuck S2. In this embodiment, the heater 15 is cast in the electrode block 1 by use of casting technology. The heater 15 used in this case is a heater fabricated by housing a nichrome wire or tungsten wire sheathed with an insulating material, such as alumina in a stainless steel tube or a carbon steel, which is called a sheathed heater, etc.

Also, the heater 15 may be of a film structure formed by using multiple layers of dielectric film 4 in which a tungsten film is sandwiched by outer layers, for example, an alumina/tungsten/alumina structure, and in this case, the construction may be such that a heater of tungsten further serves as the component electrode of an electrostatic chuck.

According to the above embodiment, because the slit for suppressing heat transfer 13 is provided in the electrode block 1, the temperature of the semiconductor wafer W can be arbitrarily controlled and, at the same time, thermal efficiency can also be dramatically improved. However, it might be thought that the rigidity of the electrode block 1 is decreased by providing the slit for suppressing heat transfer 13.

Figure 11A:
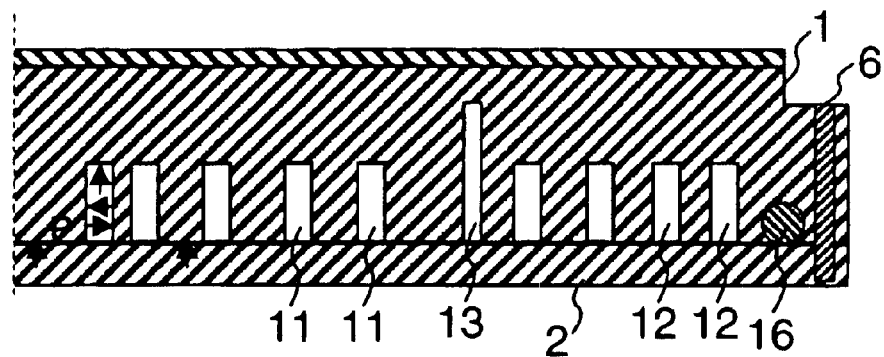
FIG. 11A is an explanatory drawing of an example of deformation that occurs in an electrode block of an electrostatic chuck according to the invention, which shows a state before deformation.

Therefore, next, an explanation will be given to this embodiment of the invention in which a decrease in rigidity due to the providing of this slit is suppressed concerning the case of the electrostatic chuck S shown in FIG. 1. In this case, as shown in FIG. 11A, the electrostatic chuck S is constituted by an electrode block 1 and a guide member 2. And in this guide member 2, an O-ring 16 is fitted in the outermost peripheral part and the guide member 2 is tightened to the electrode block 1 by means of blots 6, although this is omitted in FIG. 1.

Figure 11B:
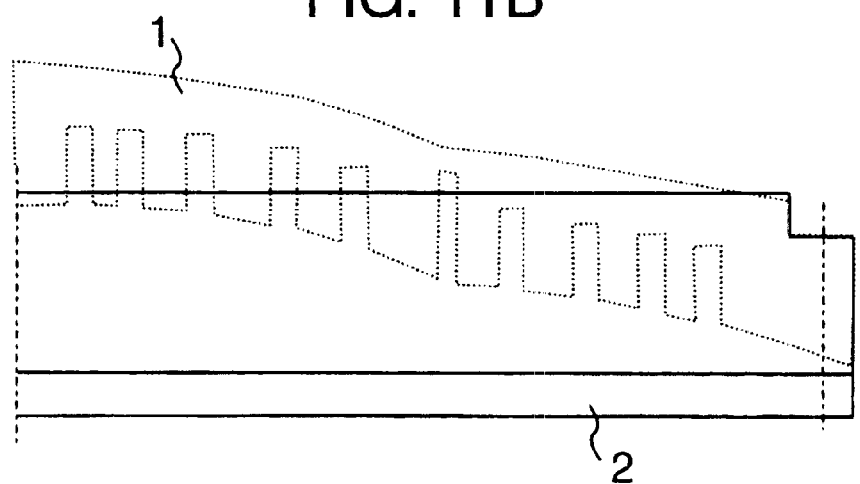
FIG. 11B is an explanatory drawing of an example of deformation that occurs in an electrode block of an electrostatic chuck according to the invention, which shows a state after deformation.

The pressure P of the coolant that flows through the slits 11, 12 is usually 500 KPa or so. However, because this pressure is applied to each of the slits 11, 12, the electrode block 1 undergoes deformation as drawn by a broken line in an exaggerated form in FIG. 11B.

Figure 12:
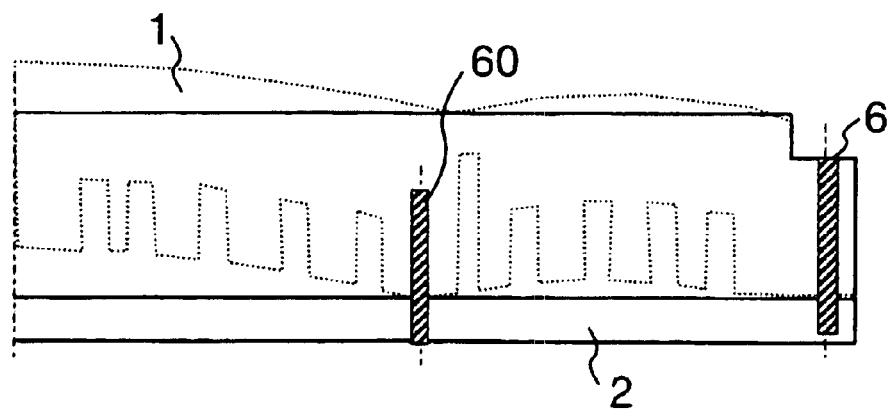
FIG. 12 is an explanatory drawing of another example of deformation that occurs in an electrode block of an electrostatic chuck according to the invention.

Therefore, in order to cope with such deformation and prevent the deformation, as shown in FIG. 12, it is necessary only that the electrode block 1 be tightened by means of another bolt 60 from the back side of the guide member 2 in a position corresponding to half the radius of the electrode block 1. This enables deformation to be suppressed as drawn in an exaggerated form in the figure.

According to results of measurement, in a case where only the outermost peripheral part of electrode block 1 with a diameter of 320 mm and a thickness of 25 mm, deformation of 0.5 mm or so was observed in the center part. However, as shown in FIG. 12, when another bolt 60 was provided, deformation scarcely occurred and good results were obtained.

Incidentally, in the case of the above-described embodiment, an electrostatic chuck S with a better thermal efficiency can be obtained by fabricating the electrode block 1 from a material of lower thermal conductivity than the guide member 2. In the above embodiment, the material for the electrode block 1 is aluminum and the material for the guide member 2 is stainless steel as described above. This meets the above conditions. Incidentally, the method of tightening the electrode block 1 and the guide member 2 together is not limited to the above screwing by means of bolts. Other tightening methods, such as brazing, diffusion bonding and electron beam welding, may also be adopted.

Figure 13:
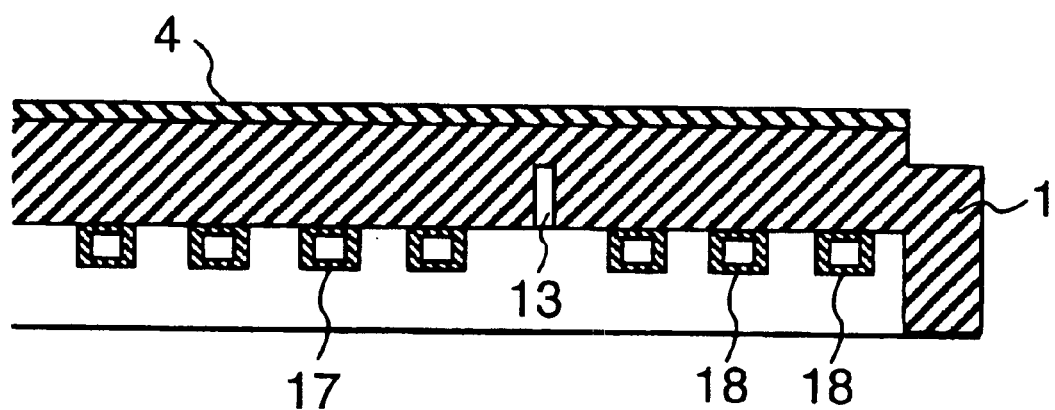
FIG. 13 is a sectional view of the fourth embodiment of an electrostatic chuck according to the invention.
Figure 14:
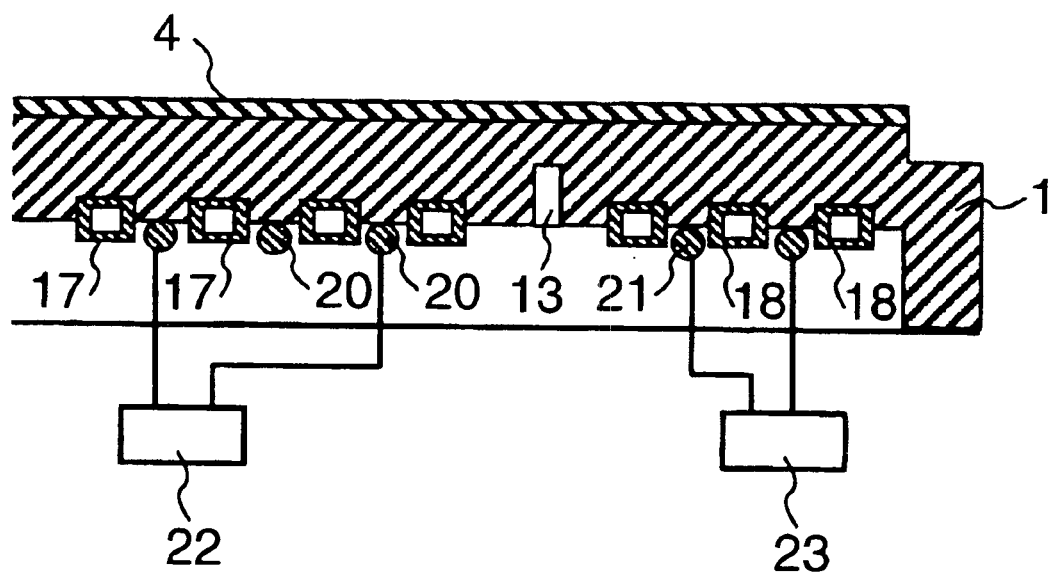
FIG. 14 is a sectional view of the fifth embodiment of an electrostatic chuck according to the invention.

Next, as still further embodiments of the invention, an explanation will be given to an electrostatic chuck that is especially excellent in temperature response. First, FIG. 13 shows the fourth embodiment of the invention. In the electrostatic chuck S3 of this embodiment, instead of forming slits that serve as coolant flow paths in the electrode block 1, pipes 17, 18 are brazed to the underside of the electrode block 1. Next, FIG. 14 shows the fifth embodiment of the invention. In this figure is shown an electrostatic chuck S4 of the invention in a case where pipes 17, 18 that are brazed after being half embedded on the underside of an electrode block 1 and heaters 20, 21 are individually provided, respectively, for the pipes 15, 16.

In both FIG. 13 and FIG. 14, the pipes 17 form coolant flow paths on the inner peripheral side and the pipes 18 form coolant flow paths on the outer peripheral side. In these cases, the pipes 17, 18 are formed in square form. The pipes 17, 18 may have an arbitrary polygonal sectional form and of course they may be ordinary round pipes.

Therefore, first, although the electrostatic chuck S3 shown in FIG. 3 is almost the same as the electrostatic chuck S shown in FIG. 1, this electrostatic chuck S3 is excellent in temperature response because the electrode block is thin.

Also, the electrostatic chuck S4 shown in FIG. 14 is excellent in temperature response. In this case, because the heaters 20, 21 are provided on the inner and outer peripheral sides, respectively, of the slit for suppressing heat transfer 13, it is possible to obtain a temperature distribution of finer temperature change by controlling the temperature by these heaters by means of each power controller 22, 23. As an example, temperature characteristics were measured by causing a coolant to circulate by setting the power supplied to each of the heaters 20, 21 at 300 W and the flow rate of the coolant at 4 l/minute. As a result, it was easy to realize a temperature distribution pattern with a temperature difference of 15° C. in which the temperature in the center part is high and a temperature distribution pattern with a temperature difference of 15° C. in which the temperature in the outer peripheral part is high.

In the electrostatic chucks S3, S4 shown in FIGS. 13 and 14, because the pressure of the coolant acts only on the interior of the pipes 17, 18 and no direct pressure is applied to the electrode block 1, there is no fear of the occurrence of deformation in the electrode block 1. In these embodiments, the pipes 17, 18 and heaters 20, 21 may be cast into the electrode block 1.

Incidentally, although the foregoing applies to the embodiments in which the number of the slit for suppressing heat transfer 13 that is formed within the block 1 is 1, a plurality of slits for suppressing heat transfer 13 may be provided as required. And in this case, it is possible to easily realize a temperature distribution with patterns of finer changes and a semiconductor wafer can be controlled to an arbitrary temperature distribution.

With the above-described embodiments, in controlling the electrostatic chuck S, etc. to a prescribed temperature distribution, it is necessary that a plurality of temperature sensors be provided within the electrode block 1. In this case, as described above, because usually the temperature of the outermost peripheral part of the semiconductor wafer shows a tendency to rise relatively in the plane of the semiconductor wafer, by providing temperature sensors in at least three places between the center of the semiconductor wafer and the outer periphery part it is possible to perform control while monitoring a temperature distribution pattern in which the temperature in the center part is high, a temperature distribution pattern in which the temperature in the outer peripheral part is high, etc.

According to the invention, by providing a slit for suppressing heat transfer in an electrode block and independent temperature control mechanisms that sandwich this slit on the inner and outer peripheries, it has become possible to control the temperature distribution to temperatures that are independent in the plane of the electrode block. As a result, it has become easy to adapt to changes in temperature distribution patterns of semiconductor wafer.

And as a result, it has become possible to accomplish diversified processing of semiconductor wafers by use of various kinds of temperature distribution patterns, thus contributing greatly to an improvement in the performance of semiconductor wafers.

Furthermore, according to the invention, the heat-medium flow paths are composed of divided members and each divided member is tightened by screwing, bracing, diffusion bonding and electron beam welding. Therefore, it is possible to easily adapt to deformation of the electrode block by the pressure of the heat medium.

According to the invention, because the coolant flow paths may also be formed from pipes having a circular or polygonal section, general-purpose parts can be used and the heat capacity of the electrode block also decreases. Therefore, an electrostatic chuck and a plasma processing apparatus that are excellent in thermal response can be provided.

Therefore, according to the plasma processing of this invention, the temperature control of semiconductor wafers can be arbitrarily set and, at the same time, requirements for uniform etching can be easily met. Therefore, the yield of semiconductor devices can be substantially improved and cost can be sufficiently reduced.

It should be further understood by those skilled in the art that the foregoing description has been made on embodiments of the invention and that various changes and modifications may be made in the invention without departing from the spirit of the invention and the scope of the appended claims.

What is claimed is:

1. A plasma processing apparatus provided with a holding stage of a system in which a temperature of an electrode block is controlled so as to control a temperature of a semiconductor wafer, wherein said electrode block is provided with at least first and second independent temperature control means on the inner and outer sides thereof and, a slit for suppressing heat transfer is provided in said electrode block between said first and second independent temperature control means.

2. The plasma processing apparatus according to claim 1, wherein said slit for suppressing heat transfer is formed substantially concentrically.

3. The plasma processing apparatus according to claim 1, wherein a heater is provided on the backside of said electrode block.

4. The plasma processing apparatus according to claim 1, wherein a heater is built in said electrode block.

5. The plasma processing apparatus according to claim 1, wherein said electrode block is provided, on the surface thereof, with a dielectric film.

6. The plasma processing apparatus according to claim 1, wherein said electrode block is provided with temperature sensors and temperature control is performed on the basis of information from said temperature sensors.

* * * * *